(12) United States Patent
Kelly

(10) Patent No.: US 7,605,598 B2
(45) Date of Patent: Oct. 20, 2009

(54) UNDERCURRENT SENSE ARRANGEMENT AND METHOD

(75) Inventor: Brendan P. Kelly, Stockport (GB)

(73) Assignee: NXP B.V., Eindhoven (NL)

( * ) Notice: Subject to any disclaimer, the term of this patent is extended or adjusted under 35 U.S.C. 154(b) by 247 days.

(21) Appl. No.: 10/561,783

(22) PCT Filed: May 14, 2004

(86) PCT No.: PCT/IB2004/001726

§ 371 (c)(1),
(2), (4) Date: Jun. 19, 2006

(87) PCT Pub. No.: WO2004/106951

PCT Pub. Date: Dec. 9, 2004

(65) Prior Publication Data

US 2006/0232266 A1    Oct. 19, 2006

(30) Foreign Application Priority Data

May 29, 2003 (GB) ................ 0312237.1

(51) Int. Cl.
*G01R 31/26* (2006.01)
(52) U.S. Cl. ..................................... 324/769
(58) Field of Classification Search ................ 361/93.1
See application file for complete search history.

(56) References Cited

U.S. PATENT DOCUMENTS

| | | | | |
|---|---|---|---|---|
| 4,743,779 A | * | 5/1988 | Valley | 327/68 |
| 5,018,041 A | * | 5/1991 | Szepesi | 361/18 |
| 5,760,613 A | * | 6/1998 | Pulvirenti et al. | 327/67 |
| 5,815,027 A | * | 9/1998 | Tihanyi et al. | 327/543 |
| 6,624,994 B1 | * | 9/2003 | Schmoock et al. | 361/93.1 |

* cited by examiner

*Primary Examiner*—Ha Tran T Nguyen
*Assistant Examiner*—Roberto Velez

(57) ABSTRACT

An on-state low current detector uses a transistor with main (32) and sense (34) cells. Feedback circuit (36) acts to keep the voltage across main cells (32) at a substantially constant target value when the load current falls below a level that generates the target voltage value in the main cells. The target voltage value is sufficiently high to ensure that the voltages of low current detection comparator (18) are readily measurable.

14 Claims, 2 Drawing Sheets

UNDERCURRENT SENSE ARRANGEMENT AND METHOD

The invention relates to a circuit arrangement for detecting undercurrent, particularly in a semiconductor switch.

It is common to implement an on-state low current detector in integrated protected high side switches. The on-state low current detector generally measures the voltage drop across the output stage and compares it with an internal reference. If the voltage drop is too small, indicating an insufficient load current, the detector outputs a signal to indicate this.

For automotive applications, most commercial high-side switches use n-channel output stages packaged together with CMOS control circuitry that may be on a separate substrate or integrated in a self-isolated manner on a common substrate.

Typical comparators to implement on-state low current detectors in such circuits use an NMOS first stage as such circuits have generally lower offset voltages than conventional CMOS comparators. The comparator may compare the voltage with an internal reference having a predetermined temperature coefficient designed to match the temperature coefficient of the voltage drop across the output stage for small constant load currents.

A schematic of such a circuit is shown in FIG. 1.

A FET 2 with drain 4, source 6 and gate 8 is connected to an input terminal 10. The on-resistance of FET 2 will be designated $R_{DSON}$. Output terminal 12 is connected through a load 14 to ground 15. The drain 4 is connected to a battery (positive) voltage input terminal 16.

A comparator 18 has its positive input 22 connected to output terminal 12 and its negative input 20 connected to comparison node 24. The output of the comparator is on low current output terminal 21. The comparison node 24 is connected to voltage reference 26, the other terminal of the voltage reference being connected to battery terminal 16. The comparison node 24 is also connected through reference current sink 28 to ground 15.

In use, when the current I through the load drops below a predetermined value, the magnitude of the voltage V across the FET 2, given by $V=I.R_{DSON}$, falls below the reference voltage. This will cause the comparator to output a positive value, indicating that the current is below the predetermined value.

There is a significant problem with this circuit, especially where a FET with a low on-resistance $R_{DSON}$ is used. The problem is that at low load currents the voltage drop across the output stage can be very small. This is a particular issue for automotive applications, which are migrating to "cool running" strategies using parts with very low $R_{DSON}$ values to minimise the heat sinking requirements, though the same problem may occur in other applications.

For example, there may be a requirement to indicate low current when the output current falls too low, with a current of (for example) 100 mA being the minimum current to ensure that the low current indication is not triggered. With typical resistances of less than 100 mOhms, the reference voltage $V_{REF}$ in the comparator would need to be set below 5 mV for reliable detection.

Unfortunately, the comparators in conventional power switches are simply not accurate enough to detect this voltage, having an offset voltage of perhaps 20 mV.

There are a number of ways that this problem may be addressed.

One option is simply to drop the on-state low current detector feature. The feature may either be dropped altogether, or replaced with an off-state open circuit detector.

This option is not generally satisfactory, because loads such as lamps and heaters tend to fail to open circuit when they are powered. In this case, an on-state low current detector can report a fault as soon as it occurs. Thus, the provision of an on state low current detector provides a significant safety benefit. Also, an off-state open circuit detector requires a small current to flow through the load even when it is nominally in the off-state.

A second option is to use a more accurate comparator. One way of achieving this is by using analogue or digital trimming at the wafer test stage. However, this creates extra work at test time and as will be appreciated trimming cannot compensate for supply voltage variation, temperature or lifetime effects.

Another approach to improving comparator accuracy might be to use a commutating technique, but this has the significant disadvantage that the overall design becomes large and complex.

The inventor has realised that although it is necessary for cool running with heavy loads that the voltage drop is small, say less than 100 mV, it is much less critical that the voltage drop is smaller for lighter loads. Accordingly, the inventors propose using a feedback loop to adjust the gate voltage to prevent the voltage drop falling below a fixed value even with small currents, by increasing $R_{DSON}$ accordingly. Since the output voltage is held it is not possible to simply measure the output voltage to detect low current. Instead, the inventors propose to compare the voltages across main and sense cells.

The inventor therefore proposes a semiconductor device according to an aspect of the invention having:

an output transistor having main cells and sense cells;

a control input connected in common to the main and sense cells and main and sense cell controlled outputs;

an output terminal connected to one of the main cell controlled outputs for connection to a load;

a feedback circuit for measuring the voltage across the main cell controlled outputs of the output transistor and controlling the voltage on the control input to increase the voltage across the main cell controlled outputs if the magnitude of the voltage across the controlled outputs falls below a predetermined value;

a reference current supply feeding a reference current through the sense cell controlled outputs;

and a comparator arranged to compare the voltages across the main cell outputs and the sense cell outputs and to output a low-current signal when the magnitude of the voltage across the main cell outputs falls below that across the sense cell outputs.

The advantage of this circuit is that the voltages across the main and the sense cells can be many times larger at low load currents than they would be without the feedback circuit. The comparison task may therefore readily and accurately be performed with a simple comparator.

The inventors have thus side-stepped the issue of comparator accuracy.

It is possible using the invention to provide very low current thresholds where required. For example, a 10 mOhm $R_{DSON}$ device according to the invention for a nominal 10 A load could easily have a low current detection threshold of a few mA, more than a thousand times lower than the nominal current of 10 A, and offer a similar performance to traditional off-state detectors.

The invention is particularly applicable to FETs: in this case the main and sense cells are FET main and sense cells and the gates of the FETs are connected in common to the control input. The sources and drains of the FETs form the output terminals.

The feedback circuit may include a voltage reference and a comparator connected across the main cell outputs for comparing the voltage across the main cell outputs with the voltage reference, the output of the comparator being connected through a diode to the control input, the diode being orientated to pass current and hence to increase the on-resistance of the main cells when the voltage across the main cell outputs falls below the predetermined value.

In another aspect, the invention relates to a semiconductor circuit including a semiconductor device as set out above and a load connected to the output terminal of the main cells.

In a further aspect, the invention relates to a method of operating a semiconductor device, the device including an output transistor having main cells and sense cells, and a control input connected to the main and sense cells and main and sense cell controlled outputs, the method including:

driving the main and the sense cells in common;

driving a load from one of the main cell controlled outputs;

feeding a reference current through the sense cell controlled outputs;

measuring the voltage across the main cell controlled outputs and controlling the voltage on the control input to increase the voltage across the main cell controlled outputs if the magnitude of the voltage across the controlled outputs falls below a predetermined value; and comparing the voltages across the main cell outputs and the sense cell outputs and outputting a low-current signal when the magnitude of the voltage across the main cell outputs falls below that across the sense cell outputs.

For a better understanding of the invention, an embodiment will now be described with reference to the accompanying drawings, in which.

Like or similar components are given like reference numerals in the two figures.

Figure 2:
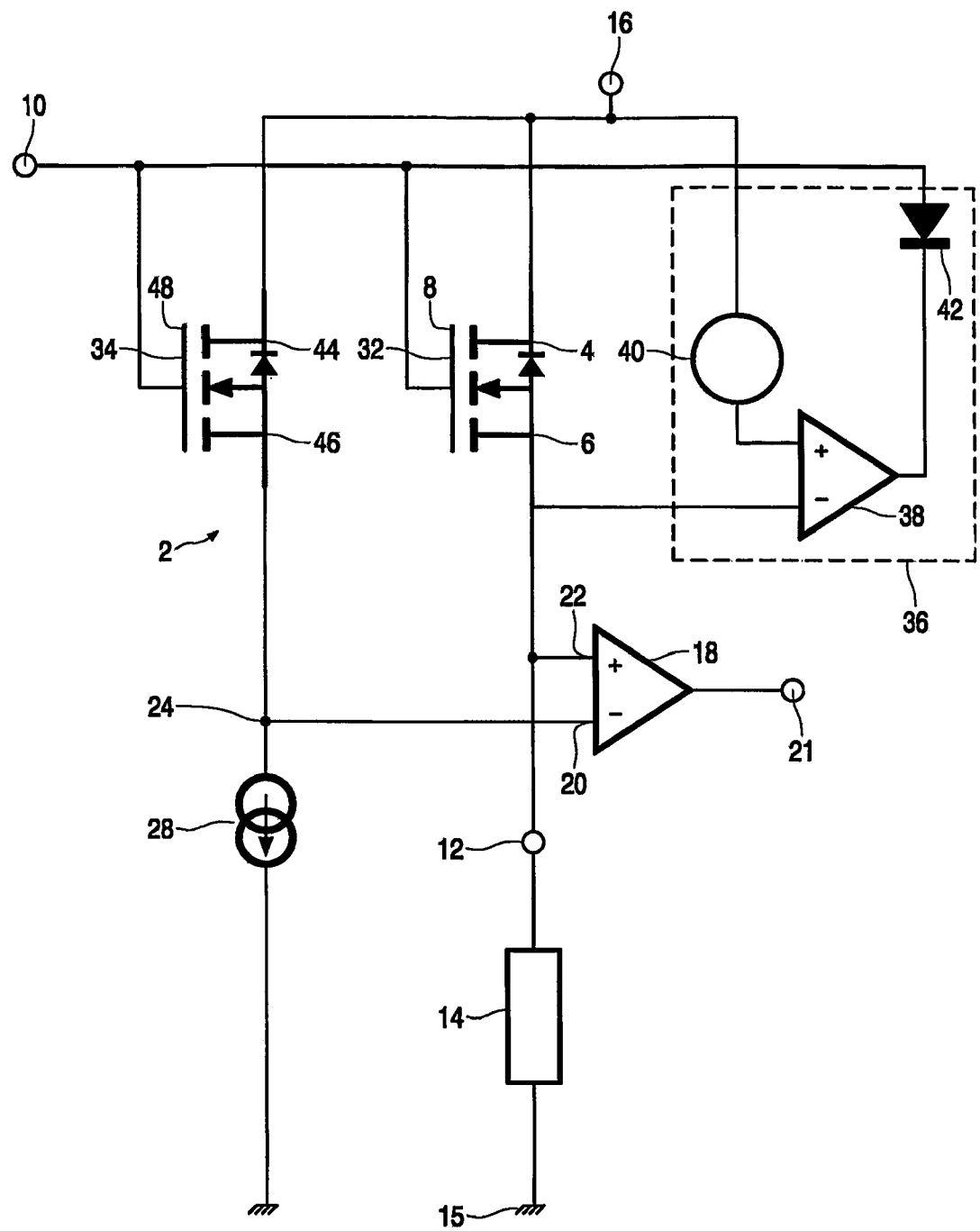
FIG. 2 shows an on-state low current detector according to the invention.

As shown in FIG. 2, a semiconductor device includes an NMOS FET 2 having $n_M$ main cells 32 making up a main part and $n_S$ sense cells 34 making up a sense part. The drains 4, 44 of the main 32 and sense 34 cells are connected in common to battery terminal 16, and the gates 8, 48 of the main 32 and sense 34 cells are connected in common to control input 10. Most of the area of the FET will be made up of main cells and a much smaller number of sense cells are provided. Manufacturing techniques for making such FETs 2 are known in the art.

The on-resistance of each of the main cells 32 will be substantially the same as that of the sense cells 34. Since there are many more main cells, connected in parallel, than sense cells connected in parallel, the on-resistance of the main part will be much lower than that of the sense part. Since the main and sense cells are substantially identical the on resistances of the main and sense parts will be linked by the proportionate relationship if they are driven in common:

$$R_{DSON, SENSE} = R_{DSON, MAIN} \cdot (n_M/n_S).$$

where $R_{DSON,SENSE}$ is the on resistance of the sense part 34, and $R_{DSON,MAIN}$ is the on resistance of the main part 32.

The source 6 of the main cells is connected to an output terminal 12.

The source 46 of the sense cells is connected to a comparison node 24, and that node is in turn connected through reference current sink 28 to ground terminal 15.

A comparator 18 is connected with its positive input connected to the output terminal, its negative input connected to the comparison node and its output connected to a low current output terminal 21 for providing a low current indication.

A feedback circuit 36 is provided, having a feedback operational amplifier (op-amp) 38 having its output connected through diode 42 to control input 10. The feedback operational amplifer 38 has a relatively low gain. The negative differential input of the op-amp 38 is connected to the output terminal 12, and the positive differential input to a voltage reference 40 generating a voltage difference of $V_{ARB}$ from the battery voltage on the battery terminal 16.

In use, a load 14 is connected between the output terminal 12 and ground 15. A battery of voltage $V_{BATTERY}$ is connected to battery terminal 16.

In normal operation with the FET 2 switched on, current $I_L$ flows through the load 14 and a predetermined reference current $I_{REF}$ through reference current sink 28. These generate voltages across the main cells 32 and the sense cells respectively. The reference current $I_{REF}$ is chosen so that the voltage dropped across the sense cells is smaller than that dropped across the main cells 34. The comparator outputs a voltage low signal to indicate current is flowing.

If the current in the load reduces, the voltage across the main cells 32 given by $V_{BL} = R_{DSON,MAIN} \cdot I_L$ reduces until its magnitude is less than the voltage given by voltage reference 40. Thus, the voltage at output terminal 12 rises. The feedback circuit 36 now comes into play. As the voltage on output terminal 12 rises it causes the op-amp 38 to output a negative signal that tends to reduce the voltage on control input 10. This causes the gate 8 of NMOS main cells 32 to become more negative, tending to switch the MOSFET off and hence increasing $R_{DSON, MAIN}$.

Note that it is important that diode 42 is oriented correctly to ensure that the feedback circuit only comes into play at lower current levels. At higher current levels, the positive output of op-amp 38 does not pass through diode 42 and feedback circuit 36 does not affect the gate drive and so the feedback circuit does not adversely affect circuit performance. In the high side NMOS device of FIG. 2 the diode is orientated with its cathode (negative-side) towards the op-amp 38.

The feedback circuit thus acts to keep the voltage across the main cell 32 constant at a target value substantially equal to $V_{ARB}$, as long as a low current flows through load 14.

The same gate voltage as applied to the main cells 32 is applied to the sense cells 34 and so the $R_{DSON,SENSE}$ value of the sense part rises proportionately to the $R_{DSON,MAIN}$ of the main part.

Only when the current in the load falls below a predetermined threshold value, given by $I_{REF}$ and the ratio of numbers of main and sense cells, will the voltage dropped across sense cells 34 be greater than that dropped across main cells 32 (approximately $V_{ARB}$). In this state the voltage on comparator terminal 24 falls below the voltage on output terminal 12 (approximately constant with value $V_{BATTERY} - V_{ARB}$). The predetermined threshold value is given by:

$$I_{THRESHOLD} = I_{REF}(R_{DSON,SENSE}/R_{DSON,MAIN}) = I_{REF}(n_M/n_S)$$

Using this relationship, the reference current $I_{REF}$ can be chosen to give a desired low current threshold $I_{THRESHOLD}$.

When the load current falls below the threshold value, the comparator gives a logic high output indicating a low current condition.

Figure 1:
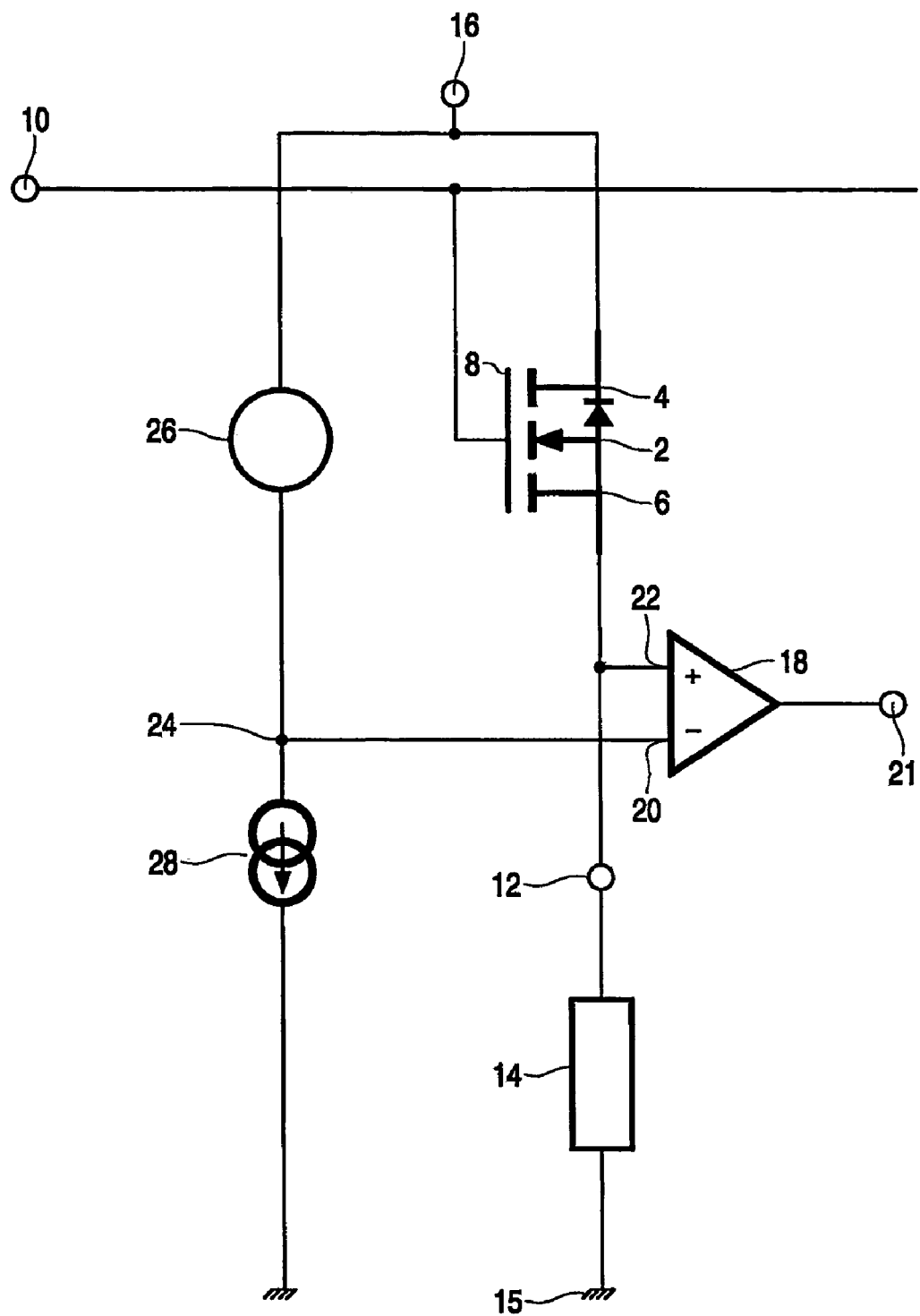
FIG. 1 shows an on-state low current detector according to related art.

The advantage of the circuit is that in the low current condition the voltage across the main cells and the sense cells is kept high by feedback circuit 36. Therefore, the voltages that output comparator 18 need to compare can be much higher than those of the related art of FIG. 1.

This in turn means that the current detector can have a low current detect threshold that can be set far lower, in relation to the nominal current, than any previous low current detector known to the inventor.

The arrangement of the invention is particularly useful in monolithic FETs using self-isolated CMOS technologies, but may of course be applied more widely. It is not limited to high-side devices of the type shown, and may also be applied to multichip devices with the power device and control arrangements implemented on separate substrates.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to such features and/or combinations of such features during the prosecution of the present Application or of any further Application derived therefrom.

What is claimed is:

1. A power semiconductor device, comprising:
   an output transistor having
      main cells and sense cells,
      a control input connected to the main and sense cells, and
      main and sense cell controlled outputs;
   an output terminal connected to one of the main cell controlled outputs for connection to a load;
   a feedback circuit for measuring the voltage across the main cell controlled outputs of the output transistor and for controlling the voltage on the control input, the feedback circuit including a first comparator configured to output a signal responsive to the magnitude of the voltage across the main cell controlled outputs and a diode connected in series between the output of the first comparator and the control input, the diode orientated to pass current between the output of the first comparator and the control input to increase the voltage across the main cell controlled outputs;
   a reference current supply feeding a reference current through the sense cell controlled outputs; and
   a second comparator arranged to compare the voltages across the main cell controlled outputs and the sense cell outputs and to output a low-current signal when the magnitude of the voltage across the main cell controlled outputs falls below that across the sense cell outputs.

2. A power semiconductor device according to claim 1 wherein the feedback circuit further includes a voltage reference, and the first comparator is connected across the main cell outputs for comparing the voltage across the main cell outputs with the voltage reference, the output of the first comparator being connected through the diode to the control input, the diode being forward biased to pass current between the output of the first comparator and the control input to change the control voltage in a direction to increase the on-resistance of the main cells responsive to the voltage across the main cell outputs falling below the voltage reference and the diode being reverse biased responsive to the voltage across the main cell outputs being above the voltage reference.

3. A power semiconductor transistor according to claim 1 wherein the main and sense cells are FET main and sense cells and the gates of the FETs are connected in common to the control input and the sources and drains of the FETs of the main and sense cells form the outputs of the FETs.

4. A power semiconductor device according to claim 3, in the form of a high side device wherein:
   the drains of the sense and main cells are connected in common to a battery terminal;
   the source of the main cells is connected to the output terminal; and
   the source of the sense cells is connected to the reference current supply, the reference current supply being a reference current sink.

5. A power semiconductor circuit including a power semiconductor device according to claim 1 further comprising a load connected to the output terminal.

6. A method of operating a semiconductor device, the device including an output transistor circuit having main cells and sense cells, a control input connected to the main and sense cells, and main and sense cell controlled outputs, the method comprising:
   driving the main and the sense cells in common;
   driving a load from one of the main cell controlled outputs feeding a reference current through the sense cell controlled outputs;
   measuring the voltage across the main cell controlled outputs and controlling the voltage on the control input to increase the voltage across the main cell controlled outputs responsive to the magnitude of the voltage across the main cell controlled outputs falling below a predetermined value;
   outputting a signal using a comparator responsive to the magnitude of the voltage across the main cell controlled outputs;
   passing current between the output of the comparator and the control input to increase the voltage across the main cell controlled out, the current being passed through a diode that is connected in series between the output of the comparator and the control input; and
   comparing the voltages across the main cell controlled outputs and the sense cell controlled outputs and outputting a low-current signal when the magnitude of the voltage across the main cell controlled outputs falls below that across the sense cell controlled outputs.

7. A method according to claim 6 wherein the step of measuring the voltage across the main cell controlled outputs includes:
   comparing the voltage across the main cell controlled outputs with a reference voltage using the comparator;
   outputting the signal by the comparator when the magnitude of the voltage across the main cell controlled outputs falls below the reference voltage; and
   responsive to the voltage across the main cell controlled outputs, the diode being forward biased to pass current between the output of the comparator and the control input to change the control input voltage in a direction to increase the on-resistance of the main cells when the voltage across the main cell outputs falls below the reference voltage and the diode being reverse biased when the voltage across the main cell outputs is above the reference voltage.

8. A device comprising:

an output transistor circuit having main cells and sense cells;

a control input connected to the main and sense cells;

main and sense cell controlled outputs;

a first circuit configured and arranged to drive the main and the sense cells in common;

a second circuit configured and arranged to drive a load from one of the main cell controlled outputs feeding a reference current through the sense cell controlled outputs;

a measurement circuit configured and arranged to measure the voltage across the main cell controlled outputs and to control the voltage on the control input, the measurement circuit including a comparator configured to output a signal responsive to the magnitude of the voltage across the main cell controlled and a diode connected in series between the output of the comparator and the control input, the diode orientated to pass current between the output of the comparator and the control input to increase the voltage across the main cell controlled outputs; and a comparison circuit configured and arranged to compare the voltages across the main cell controlled outputs and the sense cell controlled outputs and to output a low-current signal when the magnitude of the voltage across the main cell controlled outputs falls below that across the sense cell controlled outputs.

9. A device according to claim 8, wherein the diode is forward biased to pass current between the output of the comparator and the control input responsive to the voltage across the main cell outputs falling below a predetermined value and the diode is reverse biased responsive to the voltage across the main cell outputs being above the predetermined value.

10. A device according to claim 9, wherein each of the main and sense cells includes a FET-based circuit with a gate terminal, and the measurement circuit is further configured and arranged to drive the control input by outputting the signal.

11. A device according to claim 9, wherein each of the main and sense cells includes a FET-based circuit with a gate terminal, and wherein the control input is commonly connected to each gate terminal of the main and sense cells for driving the main and sense cells.

12. A device according to claim 8, further including a load connected between an output terminal of the output transistor and ground.

13. A device according to claim 8, further including a battery arranged for providing a voltage reference to the measurement circuit, and for providing power to the main and sense cells.

14. A device according to claim 8, further including a battery arranged for providing a voltage reference to the measurement circuit and for providing power to the main and sense cells, and further including a load connected between an output terminal of the output transistor and ground.

\* \* \* \* \*